(12) United States Patent
Wei et al.

(10) Patent No.: US 8,975,141 B2
(45) Date of Patent: Mar. 10, 2015

(54) DUAL WORK FUNCTION FINFET STRUCTURES AND METHODS FOR FABRICATING THE SAME

(75) Inventors: Andy C. Wei, Queensbury, NY (US); Bin Yang, San Carlos, CA (US); Francis M. Tambwe, Malta, NY (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 399 days.

(21) Appl. No.: 13/563,202

(22) Filed: Jul. 31, 2012

(65) Prior Publication Data

US 2014/0038402 A1  Feb. 6, 2014

(51) Int. Cl.
*H01L 21/336* (2006.01)

(52) U.S. Cl.
USPC ............. 438/283; 438/157; 257/E29.264; 257/E21.635; 257/E21.421

(58) Field of Classification Search
USPC ........... 257/365, E29.264, E21.635, E21.421; 438/154, 157, 283
See application file for complete search history.

(56) References Cited

U.S. PATENT DOCUMENTS 8,124,483 B2 * 2/2012 Schulz .................... 438/283

* cited by examiner

*Primary Examiner* — David Vu
(74) *Attorney, Agent, or Firm* — Ingrassia Fisher & Lorenz, P.C.

(57) ABSTRACT

A method for fabricating a dual-workfunction FinFET structure includes depositing a first workfunction material in a layer in a plurality of trenches of the FinFET structure, depositing a low-resistance material layer over the first workfunction material layer, and etching the low-resistance material layer and the first workfunction material layer from a portion of the FinFET structure. The method further includes depositing a second workfunction material in a layer in a plurality of trenches of the portion and depositing a stress material layer over the second workfunction material layer.

20 Claims, 6 Drawing Sheets

DUAL WORK FUNCTION FINFET STRUCTURES AND METHODS FOR FABRICATING THE SAME

TECHNICAL FIELD

The present invention generally relates to semiconductor devices and methods for fabricating semiconductor devices, and more particularly relates to FinFET structures having a dual workfunction and methods for fabricating the same.

BACKGROUND

In contrast to traditional planar metal-oxide-semiconductor field-effect transistors (MOSFETs), which are fabricated using conventional lithographic fabrication methods, non-planar FETs incorporate various vertical transistor structures. One such semiconductor structure is the "FinFET," which takes its name from the multiple thin silicon "fins" that are used to form the respective gate channels, and which are typically on the order of tens of nanometers in width.

More particularly, referring to the exemplary prior art non-planar FET structure shown in FIG. 1, a FinFET 100 generally includes two or more parallel silicon fin structures (or simply "fins") 104 and 106. These structures are typically formed using a silicon-on-insulator (SOI) substrate (not shown) or alternatively on a bulk substrate, with fins 104 and 106 extending between a common drain electrode and a common source electrode (not shown). A conductive gate structure 102 "wraps around" three sides of both fins 104 and 106, and is separated from the fins by a standard gate oxide layer 103. While FIG. 1 illustrates only one gate structure 102 wrapped around fins 104 and 106, two, three or more parallel gate structures can be wrapped around the fins. Fins 104 and 106 may be suitably doped to produce the desired FET polarity, as is known in the art, such that a gate channel is formed within the near surface of the fins adjacent to gate oxide 103. The width of the gate, indicated by double-headed arrow 108, determines the effective channel length of the device.

Current scaling of MOSFET dimensions leads to the need to integrate a 3-D FinFET structures into many integrated circuit (IC) designs. Embedded epitaxy for source/drain formation must also take a 3-D shape, in one example, for static random access memory (SRAM) scaling requirements. The spacers are formed in 3-D and are prone to variation induced by fin and dummy poly gate shapes. It is further difficult to control silicide formation in a 3-D technology with intentional topography, aggravated by the presence of multiple crystal planes as well as non-uniform spacer profile across the gate-source/drain interface.

In addition, performance and scaling requires the fin height to increase and the fin pitch to decrease in future nodes. An increase in fin height increases the width of the device, but the smaller fin pitch decreases the area of the contact that can be made around the device. At the same time, the smaller gate pitch further decreases the contact size. As such, to make further advances in scaling, better contact-active resistance is required and/or an increase in device stress is required.

To further reduce scale in an SRAM in future nodes, it is desirable to block the epitaxial source/drain (S/D) components from the fins, and rely only on the fins themselves as the S/D. The SRAM transistor in such a device using currently known methods, however, would have unacceptably high contact resistance if a conventional silicide were formed. A contact liner that has the properties of not consuming the fins as well as delivering band-edge low Schottky barrier height properties would make such a scheme possible.

Existing solutions known in the art have attempted to merge the fins together, and have the silicide only from the top. That is, existing solutions known in the art have attempted to transform the 3-D problem into a known 2-D problem. However, merging the fins requires extra space in the SRAM to separate the n-type metal oxide semiconductor (NMOS) from the p-type metal oxide semiconductor (PMOS). This severely increases the silicon area to manufacture a chip. Also, contacting only from the top in 2-D rather than wrapping the contact around in 3-D severely decreases the contact area, thus increasing the contact-active resistance substantially and reducing device performance.

Accordingly, it is desirable to provide FinFET structures and methods for fabricating FinFET structures that incorporate a scheme in which dual band-edge metals or metal compounds can be integrated into a self-aligned contact scheme. Furthermore, other desirable features and characteristics of the present invention will become apparent from the subsequent detailed description of the invention and the appended claims, taken in conjunction with the accompanying drawings, the brief summary, and this background of the invention.

BRIEF SUMMARY

FinFET structures and methods for fabricating FinFET structures are provided herein. In accordance with an exemplary embodiment of the present invention, a method for fabricating a dual-workfunction FinFET structure includes depositing an n-type workfunction material in a layer over a plurality of gate structures of each a PMOS and an NMOS and in a plurality of trenches between said gate structures, depositing a low-resistance material layer over the n-type workfunction material layer, and depositing a DUO material layer over the plurality of gate structures of the NMOS. The method further includes etching the low-resistance material layer and the n-type workfunction material layer from the PMOS and etching the DUO material layer from over the NMOS. Still further, the method includes depositing a p-type workfunction material in a layer over the plurality of gate structures of the PMOS and in the plurality of trenches between said gate structures of the PMOS and depositing a compressive stress material layer over the p-type workfunction material layer. In accordance with another exemplary embodiment, a method for fabricating a dual-workfunction FinFET structure includes depositing a first workfunction material in a layer in a plurality of trenches of the FinFET structure, depositing a low-resistance material layer over the first workfunction material layer, and depositing a photoactive etching material layer over a first portion of the FinFET structure. The method further includes etching the low-resistance material layer and the first workfunction material layer from a second portion of the FinFET structure, etching the photoactive etching material layer from over the first portion, and depositing a second workfunction material in a layer in a plurality of trenches of the second portion. Still further, the method includes depositing a compressive stress material layer over the second workfunction material layer.

In accordance with yet another exemplary embodiment, a method for fabricating a dual-workfunction FinFET structure includes depositing a first workfunction material in a layer in a plurality of trenches of the FinFET structure, depositing a low-resistance material layer over the first workfunction material layer, and etching the low-resistance material layer and the first workfunction material layer from a portion of the FinFET structure. The method further includes depositing a second workfunction material in a layer in a plurality of trenches of the portion and depositing a compressive stress material layer over the second workfunction material layer.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. As used herein, the word "exemplary" means "serving as an example, instance, or illustration." Thus, any embodiment described herein as "exemplary" is not necessarily to be construed as preferred or advantageous over other embodiments. All of the embodiments described herein are exemplary embodiments provided to enable persons skilled in the art to make or use the invention and not to limit the scope of the invention which is defined by the claims. Furthermore, there is no intention to be bound by any expressed or implied theory presented in the preceding technical field, background, brief summary, or the following detailed description.

For the sake of brevity, conventional techniques related to FinFET semiconductor device fabrication may not be described in detail herein. Moreover, the various tasks and process steps described herein may be incorporated into a more comprehensive procedure or process having additional steps or functionality not described in detail herein. In particular, various steps in the manufacture of semiconductor based transistors are well known and so, in the interest of brevity, many conventional steps will only be mentioned briefly herein or will be omitted entirely without providing the well-known process details. As such, the embodiments described herein, again for the sake of brevity, commence discussion after the fin and gate structures have been formed.

Figure 1:
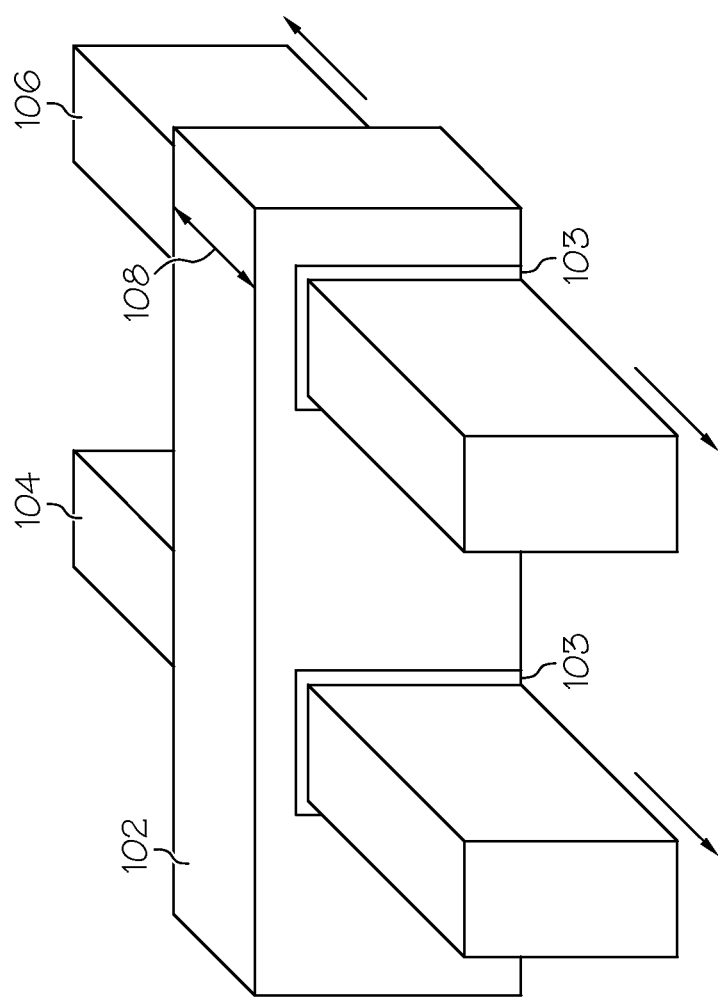
FIG. 1 is an isometric schematic view of a FinFET structure available in the prior art.
Figure 2:
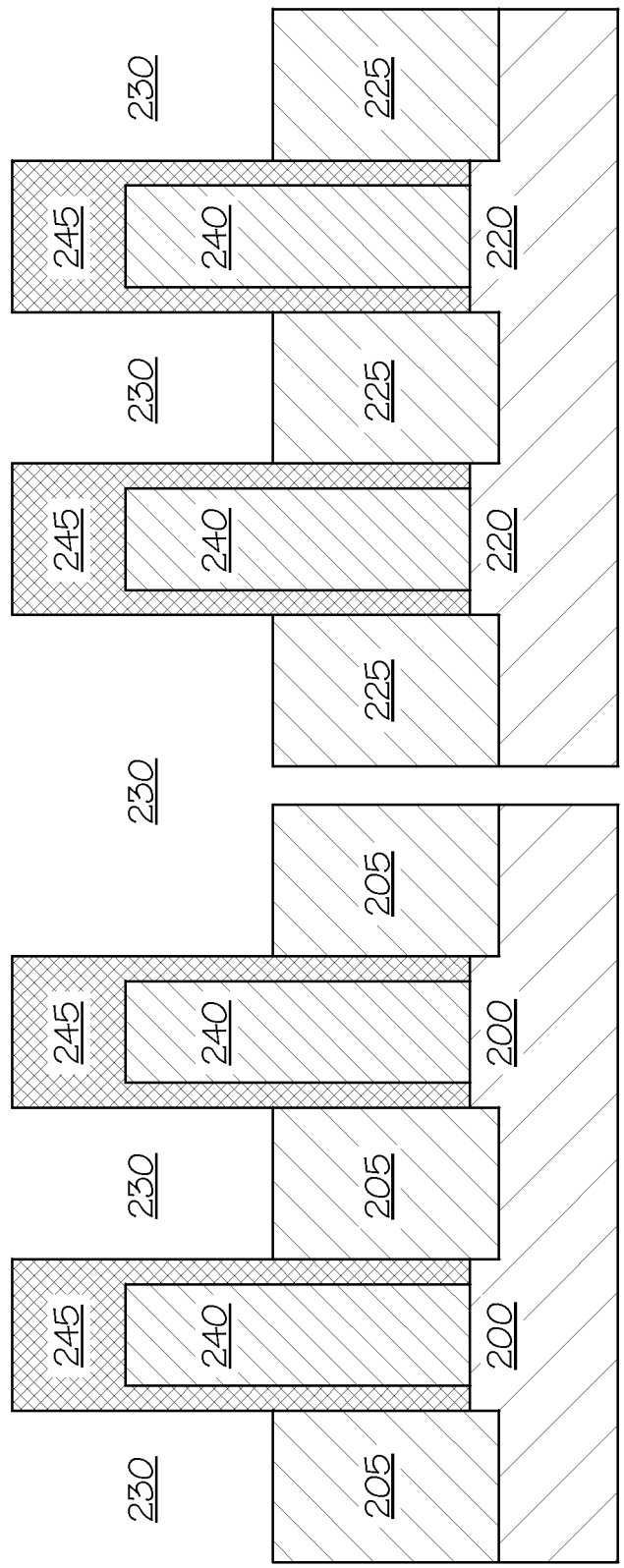
FIGS. 2-6 are cross-sectional views of a FinFET structure illustrating methods for fabricating a FinFET structure with dual workfunctions in accordance with the present disclosure.

Reference will now be made to FIGS. 2-6, wherein, in an embodiment, process steps in a method for employing a scheme in which dual band-edge metals or metal compounds can be integrated into a self-aligned contact scheme in the fabrication of a FinFET semiconductor device. Each figure thereof includes a cross-sectional view of the FinFET structure. With particular reference to FIG. 1, the contact integration scheme begins with a previously formed FinFET structure. As noted above, methods for forming such FinFET structures are well-known in the art, and need not be repeated here. The FinFET structure includes at least a PMOS 200 and an NMOS 220. An oxide layer 230, such as a silicon oxide layer, separates the PMOS 200 from the NMOS 220. The PMOS 200 includes a p-type doped channel 205, for example including epitaxial SiGe (eSiGe) or other p-type material. The NMOS 220 includes an n-type doped channel 225, for example including epitaxial Si:C (eSi:C) or other n-type material.

The gate structure 240 on each the PMOS 200 and the NMOS is a replacement metal gate (RMG), i.e., a gate that has been formed using "gate-last" technology. As will be appreciated by those having ordinary skill in the art, a gate-last process is to form a dummy gate structure used to self-align the source and drain implant and anneals, and then strip out the dummy gate materials and replace them with the high-k and metal gate materials. The flow forms an $SiO_2$ or SiON interface between the silicon substrate and the high-k dielectric. A thin protective interfacial layer of metal is then deposited above the dielectric, followed by the temporary polysilicon gate. This is followed by forming the source and drain, salicidation, and depositing the contact etch stop and first inter-layer dielectric. At this point, the polysilicon gates are removed and substantially more metal is added to the interfacial layers to complete the RMG. The gate structure 240 includes a self-aligned contact silicon nitride cap 245 that surrounds the gate structure 240 on three sides.

Figure 3:
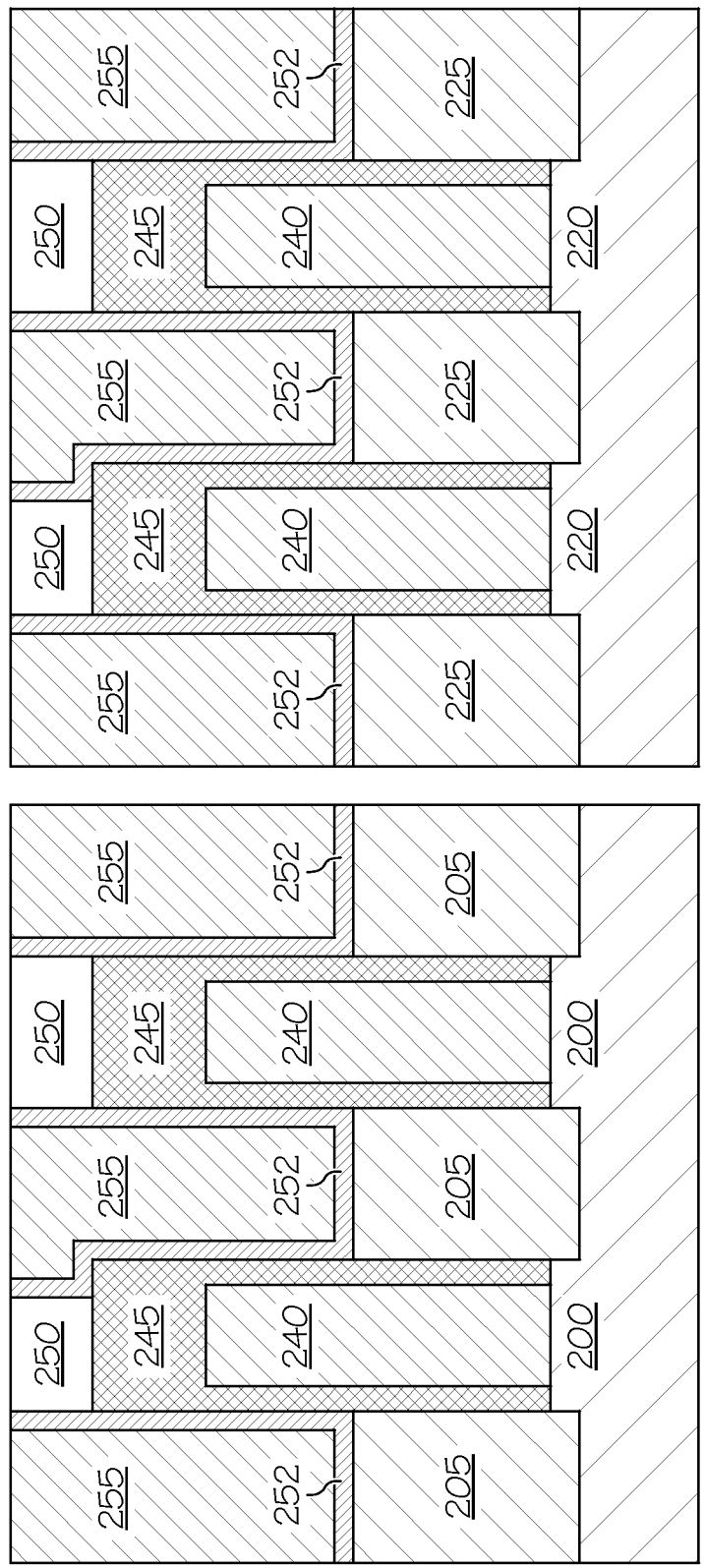

Referring now to FIG. 3, the process continues with removal of the oxide layer 230 using etching, or any other known technique. Thereafter, the method includes selectively forming a tetraethyl orthosilicate layer 250 over part or all of each of the silicon nitride caps 245 surrounding the gate structures 240. TEOS layer 250 is selectively deposited as an etch stop layer for subsequent etching procedures as will be described in greater detail below. In an embodiment, TEOS can be deposited using, for example, chemical vapor deposition (CVD), or any other technique known in the art.

With continued reference to FIG. 3, the process continues with the conformal deposition of an n-type workfunction material layer 252. Any material that is on the n-side of the band-gap, and can be deposited using a process that provides for conformal deposition, for example ALD, may be used. In one embodiment, the n-type workfunction material is erbium (Er). As such, a layer of the Er or other n-type workfunction material 252 is deposited over the channels 205, 225 and in between the gate structures 240.

Subsequent to deposition of the n-type workfunction material layer 252, a low-resistance material layer 255 is deposited over the n-type workfunction material layer 252 to fill the trenches formed in between the gate structures 240. In one embodiment, the low-resistance material layer 255 is a low-resistance tungsten (LRW) material, as will be known in the art. After deposition of the low-resistance material layer 255, the structure may be polished to the TEOS layer 250 using, for example, chemical mechanical planarization techniques (CMP).

Figure 4:
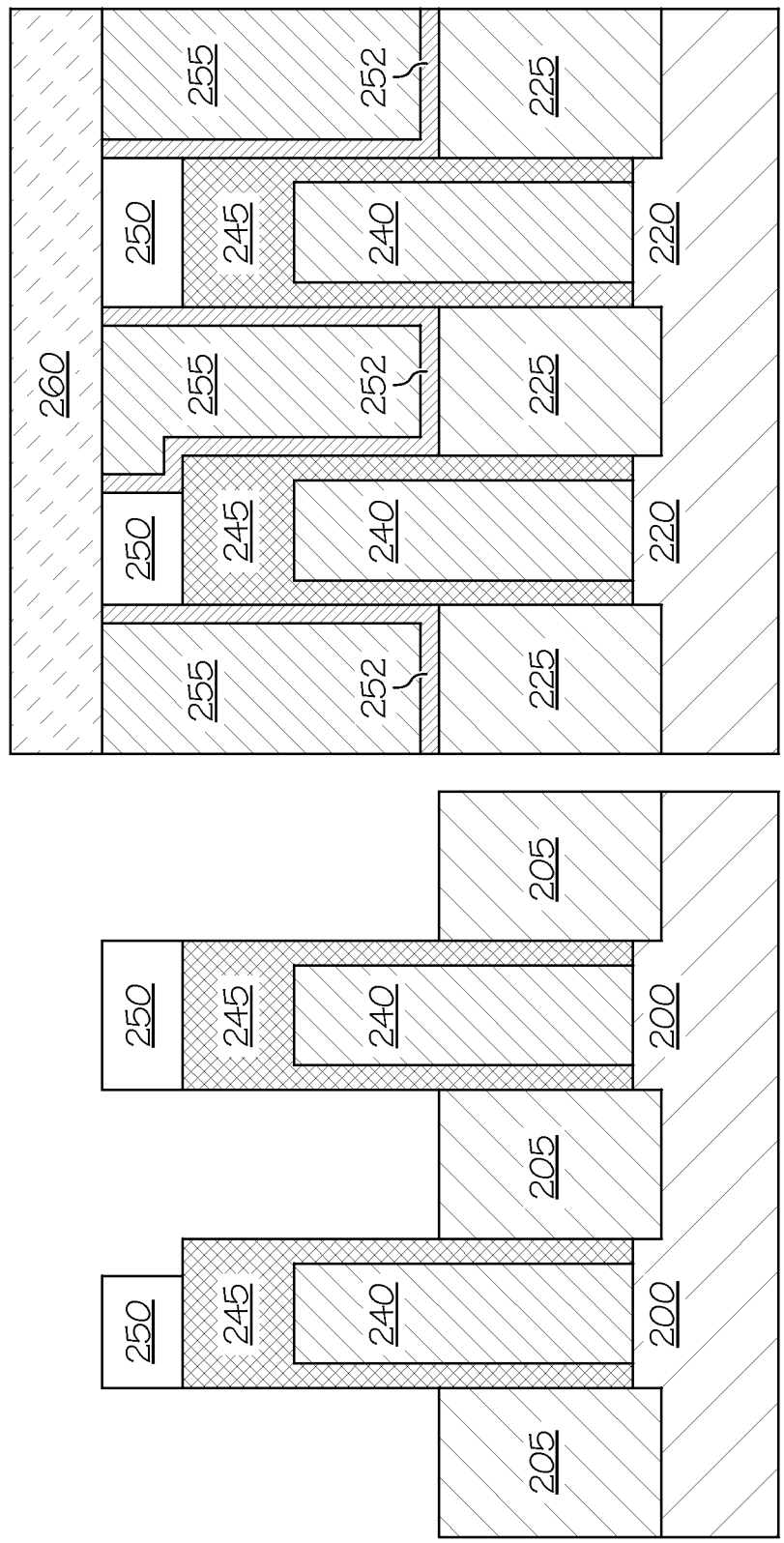

Referring now to FIG. 4, subsequent to the deposition of the low-resistance material layer 255, a layer of a deep ultraviolet light-absorbing oxide (DUO) 260 is conformally deposited. The DUO material, a photoactive etching material, is used in connection with deep ultraviolet lithography to for differential etching. As shown in FIG. 4, a DUO layer 260 is deposited over the NMOS 220, but not the PMOS 200. With the DUO layer 260 in place, it is possible to remove the n-type workfunction layer 252 from the PMOS 200 via a wet etchant that removes most metals/nitrides/carbides selective to oxide, nitride, and silicon. In one embodiment, a suitable etchant for use herein is sulfuric-peroxide solution.

Figure 5:
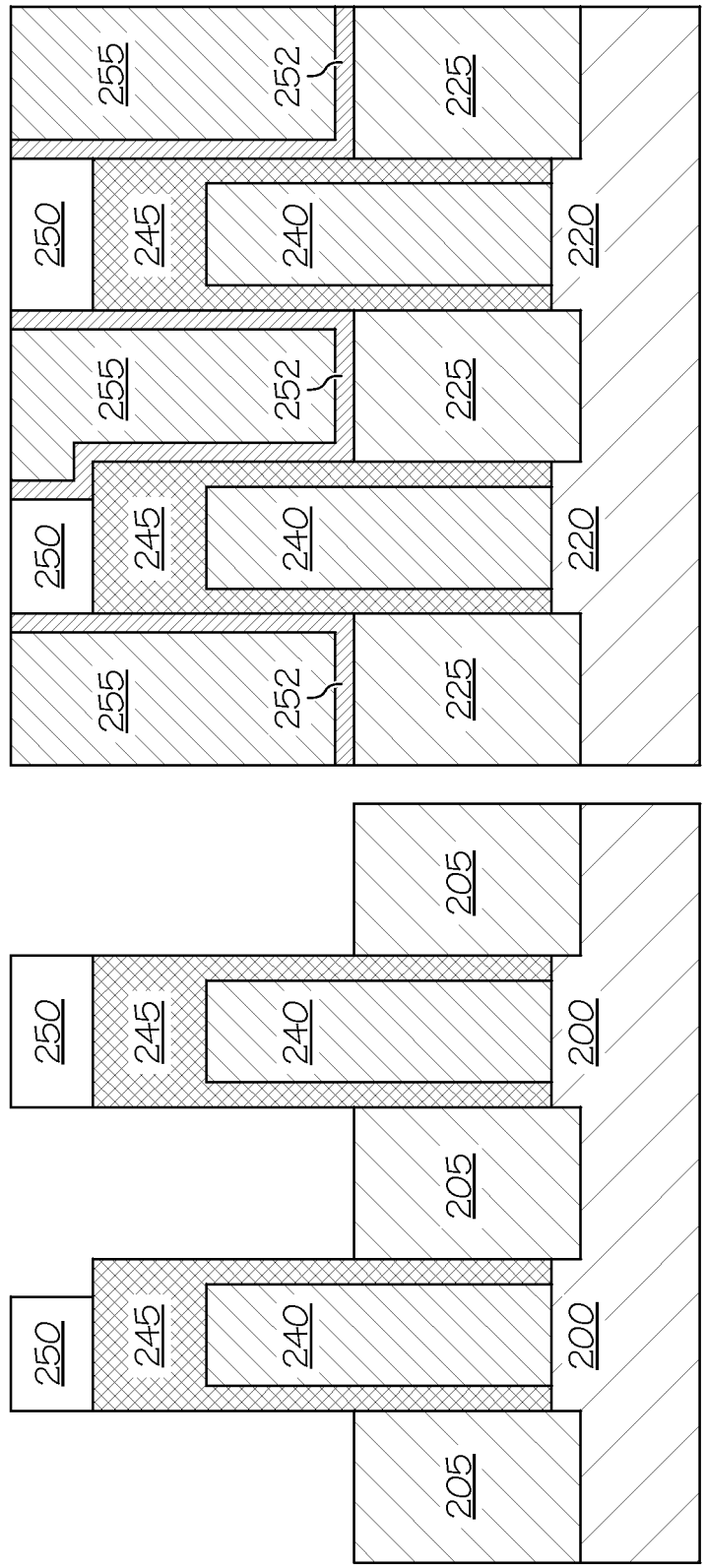

Referring now to FIG. 5, subsequent to the etching that removes the aforementioned metals/nitrides/carbides, the DUO material layer 260 is removed using a wet etchant selective to TEOS. In one embodiment, a suitable etchant for use herein is HF. In particular, HF is known to oxidize DUO, thereby allowing for its removal selective to TEOS (in a ratio of about 100:1). Furthermore, it is also noted that the low-resistance layer 255 is not etched by HF, and therefore remains in place as with the TEOS.

Figure 6:
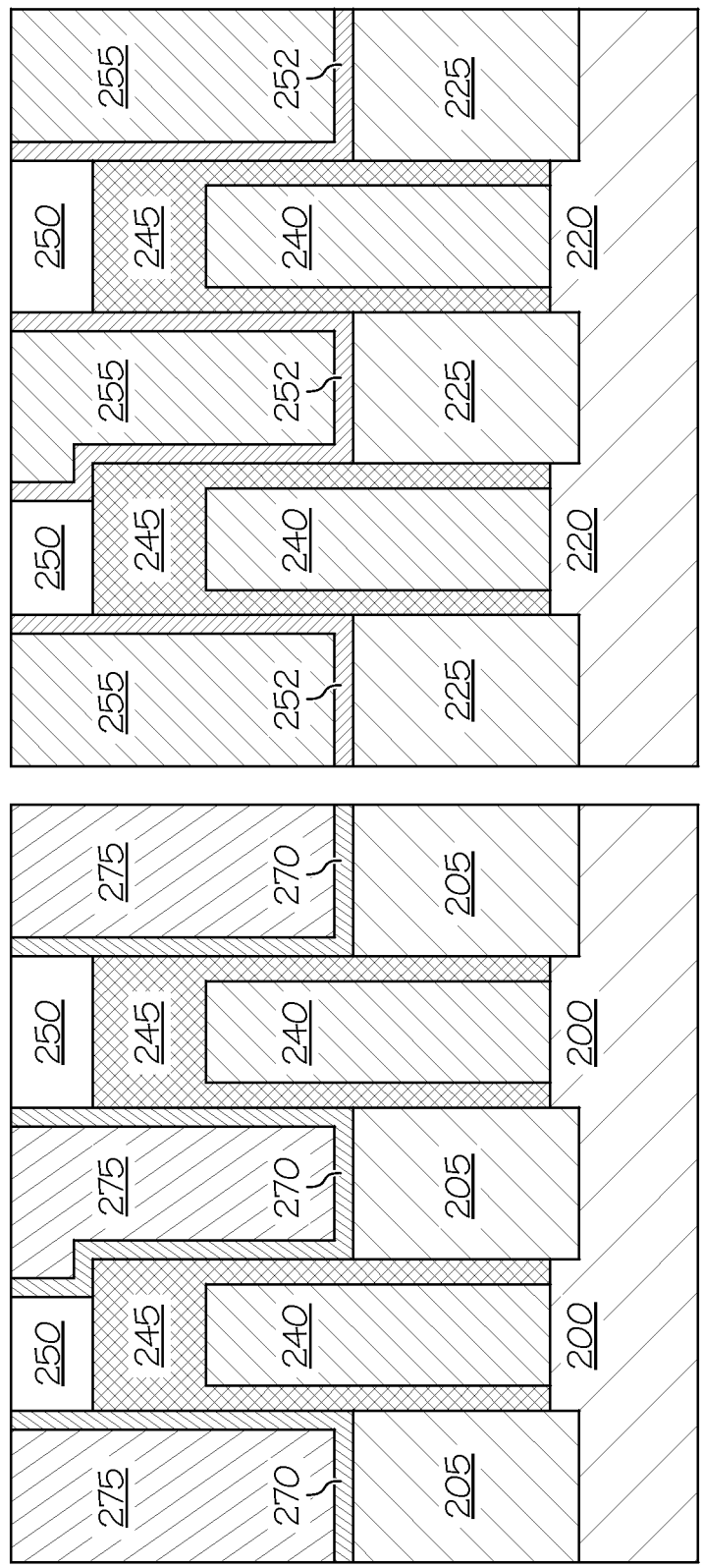

Referring now to FIG. 6, the process continues with the conformal deposition of a p-type workfunction material layer 270. Any material that is on the p-side of the band-gap, and can be deposited using a process that provides for conformal deposition, for example ALD, may be used. In one embodiment, the p-type workfunction material is Pt. As such, a layer of the Pt or other p-type workfunction material 270 is deposited over the channels 205 and in between the gate structures 240.

Subsequent to deposition of the p-type workfunction material layer 260, a compressive fill metal layer 275 is deposited over the p-type workfunction material layer 270 to fill the trenches formed in between the gate structures 240. In one embodiment, the compressive fill metal layer 275 is $TiAl_3$. Other such materials may alternatively be used as will be known in the art. After deposition of the compressive fill metal layer 275, the structure may be polished to the TEOS layer 250 using, for example, chemical mechanical planarization techniques (CMP). It will be appreciated that the compressive fill metal 275 can be selected so as to enhance the compressive stress in the PMOS 200.

Further discussion is now provided with regard to the selection of the n-type workfunction material 252 and the p-type workfunction material 270. The workfunction values $\phi$ of various metals, when in direct contact with Si, are known in the art. For example, metals with lower workfunction values $\phi$ are most suitable for NMOS devices. These include, but are not limited to, Ti, Y, Mn, and Er. In contrast, metals with higher workfunction values $\phi$ are most suitable for PMOS devices. These include, but are not limited to, Pt, Ir, and Ni. In between such ranges are suitable "mid-gap" metals such as W. Those metals that are towards n-band-edge will have a lower Schottky barrier height to n-doped Si, whereas those towards p-band-edge will have a lower Schottky barrier height to p-doped Si. Thus it is desirable to select metals near the respective band edge.

In order not to form a silicide, it is also desirable to select metals that are not reactive with Si at typical contact and back-end-of-line (BEOL) processing temperatures (for example from about 385° C. to about 480° C.), or have the metals deposited already as a silicide, as a carbide, or as a nitride. For example, nitrides tend to push the workfunction of the metal towards the p-side, and carbides tend to push the workfunction of the metal towards the n-side. Metals towards the n-band-edge tend to interact with silicon only at higher temperatures, i.e. require Si to diffuse to the metal to form a silicide, and can be used alone. Metals toward the p-band-edge tends to diffuse into silicon, thus reactions can occur at very low temperatures such as 200° C. Thus these metals need to be deposited in silicide form or in nitrided forms, contrary to the desired form as noted above.

As such, in accordance with an exemplary embodiment, and as noted above, Er, is a suitable metal for the n-type workfunction material 252, and Pt, in an exemplary embodiment, is suitable for the p-type workfunction material 270. It is expected that a person having ordinary skill in the art, following the teachings of the present disclosure will be able to select other metals for use as materials 252 and 270.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope as set forth in the appended claims and their legal equivalents.

What is claimed is:

1. A method for fabricating a dual-workfunction FinFET structure, comprising:
    depositing an n-type workfunction material in a layer over a plurality of gate structures of each a PMOS and an NMOS and in a plurality of trenches between said gate structures;
    depositing a low-resistance material layer over the n-type workfunction material layer;
    depositing a deep ultraviolet light-absorbing oxide (DUOS material layer over the plurality of gate structures of the NMOS;
    etching the low-resistance material layer and the n-type workfunction material layer from the PMOS;
    etching the DUO material layer from over the NMOS;
    depositing a p-type workfunction material in a layer over the plurality of gate structures of the PMOS and in the plurality of trenches between said gate structures of the PMOS; and
    depositing a compressive stress material layer over the p-type workfunction material layer.

2. The method of claim 1, wherein the n-type workfunction material is selected from a metal having a workfunction near an n-band edge.

3. The method of claim 2, wherein the n-type workfunction material is selected from a metal that is substantially unreactive with Si in the temperature range from about 385° C. to about 480° C.

4. The method of claim 3, wherein the n-type workfunction material is Er.

5. The method of claim 1, wherein the p-type workfunction material is selected from a metal having a workfunction near a p-band edge.

6. The method of claim 5, wherein the p-type workfunction material is selected from a metal that is substantially unreactive with Si in the temperature range from about 385° C. to about 480° C.

7. The method of claim 6, wherein the p-type workfunction material is Pt.

8. The method of claim 1, wherein the gate structures comprise a silicon nitride cap.

9. The method of claim 8, further comprising selectively depositing a TEOS layer over the silicon nitride cap.

10. The method of claim 1, wherein the low-resistance material layer is a low-resistance tungsten layer.

11. The method of claim 1, wherein the compressive stress material layer is a $TiAl_3$ layer.

12. The method of claim 1, wherein depositing the n-type workfunction material is performed prior to depositing the p-type workfunction material.

13. The method of claim 1, further comprising etching a silicon oxide layer from between the gate structures prior to depositing the n-type workfunction material.

14. The method of claim 1, wherein the gate structure is a replacement metal gate.

15. The method of claim 1, wherein an NMOS channel comprises eSi:C and wherein a PMOS channel comprises eSiGe.

16. The method of claim 1, wherein etching the low-resistance material layer and the n-type workfunction material layer from the PMOS comprises etching the low-resistance material layer and the n-type workfunction material layer from the PMOS using a sulfuric-peroxide wet etchant.

17. The method of claim 1, wherein etching the DUO material layer comprises etching the DUO material layer using a HF solution.

18. The method of claim 1, further comprising performing a CMP process on the FinFET structure after depositing the low-resistance material layer or after depositing the compressive stress material layer.

19. A method for fabricating a dual-workfunction FinFET structure, comprising:
- depositing a first workfunction material in a layer in a plurality of trenches of the FinFET structure;
- depositing a low-resistance material layer over the first workfunction material layer;
- depositing a photoactive etching material layer over a first portion of the FinFET structure;
- etching the low-resistance material layer and the first workfunction material layer from a second portion of the FinFET structure;
- etching the photoactive etching material layer from over the first portion;
- depositing a second workfunction material in a layer in a plurality of trenches of the second portion; and
- depositing a compressive stress material layer over the second workfunction material layer.

20. A method for fabricating a dual-workfunction FinFET structure, comprising:
- depositing a first workfunction material in a layer in a plurality of trenches of the FinFET structure;
- depositing a low-resistance material layer over the first workfunction material layer;
- etching the low-resistance material layer and the first workfunction material layer from a portion of the FinFET structure;
- depositing a second workfunction material in a layer in a plurality of trenches of the portion; and
- depositing a stress material layer over the second workfunction material layer.

* * * * *